United States Patent
Yuan et al.

(10) Patent No.: US 10,809,302 B2
(45) Date of Patent: Oct. 20, 2020

(54) ONLINE DETECTION METHOD FOR INTERNAL SHORT-CIRCUIT OF BATTERY

(71) Applicant: NIO NEXTEV LIMITED, Hong Kong (CN)

(72) Inventors: Shengjie Yuan, Shanghai (CN); Gaokun Liu, Shanghai (CN); Chong He, Shanghai (CN)

(73) Assignee: NIO NEXTEV LIMITED, Hong Kong (CN)

( * ) Notice: Subject to any disclaimer, the term of this patent is extended or adjusted under 35 U.S.C. 154(b) by 432 days.

(21) Appl. No.: 15/843,841

(22) Filed: Dec. 15, 2017

(65) Prior Publication Data
US 2018/0172772 A1    Jun. 21, 2018

(30) Foreign Application Priority Data
Dec. 16, 2016   (CN) .......................... 2016 1 1169204

(51) Int. Cl.
*G01R 31/36*     (2020.01)
*G01R 31/389*    (2019.01)
(Continued)

(52) U.S. Cl.
CPC ....... *G01R 31/3648* (2013.01); *G01R 31/389* (2019.01); *G01R 31/396* (2019.01); *G01R 31/50* (2020.01); *H01M 2/1077* (2013.01); *H01M 10/48* (2013.01); *H01M 10/482* (2013.01); *H02J 7/0029* (2013.01);
(Continued)

(58) Field of Classification Search
None
See application file for complete search history.

(56) References Cited

U.S. PATENT DOCUMENTS

| | | | |
|---|---|---|---|
| 6,255,803 B1 * | 7/2001 | Ishihara | G01R 31/3648 320/134 |
| 2006/0208708 A1 * | 9/2006 | Ishishita | G01R 31/396 320/166 |
| 2011/0298417 A1 | 12/2011 | Stewart et al. | |

FOREIGN PATENT DOCUMENTS

| | | |
|---|---|---|
| CN | 1174441 | 2/1998 |
| CN | 102104180 | 6/2011 |

(Continued)

OTHER PUBLICATIONS

International Search Report for International (PCT) Patent Application No. PCT/CN2017/095094, dated Sep. 28, 2017, 5 pages.

*Primary Examiner* — David V Henze-Gongola
(74) *Attorney, Agent, or Firm* — Sheridan Ross P.C.

(57) ABSTRACT

The present application relates to an online detection method for internal short-circuit of power battery, which comprises the following steps: in the process of charging and discharging, when the state of charge of a power battery is greater than a preset first threshold, monitoring and recording the voltage for each cell in the power battery; in accordance with the recorded historical voltages of each cell, determining whether there is a cell with voltage less than a second threshold in the process of charging, and less than a third threshold in the process of discharging, if so, then marking the corresponding cell as an internal short-circuited cell. The present application could accurately determine whether a malfunction of internal circuit of power battery occurs during the operation of a vehicle, so as to guarantee the safety of the vehicle and the people on-board.

16 Claims, 2 Drawing Sheets

(51) Int. Cl.
*G01R 31/396* (2019.01)
*H01M 10/48* (2006.01)
*G01R 31/50* (2020.01)
*H01M 2/10* (2006.01)
*H02J 7/00* (2006.01)
*H01M 10/613* (2014.01)
*H01M 2/34* (2006.01)

(52) U.S. Cl.
CPC .............. *H02J 7/0068* (2013.01); *H01M 2/34* (2013.01); *H01M 10/613* (2015.04); *H01M 2200/00* (2013.01); *H01M 2220/20* (2013.01)

(56) References Cited

FOREIGN PATENT DOCUMENTS

| | | |
|---|---|---|
| CN | 103163464 | 6/2013 |
| CN | 103545564 | 1/2014 |
| CN | 204302468 | 4/2015 |
| CN | 105790341 | 7/2016 |
| JP | 2014-002009 | 1/2014 |
| JP | 2016-207646 | 12/2016 |

* cited by examiner

ONLINE DETECTION METHOD FOR INTERNAL SHORT-CIRCUIT OF BATTERY

CROSS-REFERENCE TO RELATED APPLICATION

This application claims the benefit of China Patent Application No. 201611169204.3 filed Dec. 16, 2016, the entire contents of which are incorporated herein by reference.

TECHNICAL FIELD

The present application relates to the field of battery detection, and more particularly to an online detection method for internal short-circuit of battery.

BACKGROUND

A schematic diagram of the phenomenon of internal short-circuit of a battery is shown in FIG. 1, the cause of which is: the existence of impurities in the battery, and the damage of internal diaphragm 2 of the battery caused by the lithium dendrites that may be formed during usage, will cause the anode and cathode of the battery to contact each other directly, so that an internal short-circuit will appear at region 1.

Because the battery has a sealed structure, once an internal short-circuit occurs in the battery, it will be interminable until the battery is depleted. The internal short-circuit of a battery may have following effects: (1) there is a continuous internal discharge of the battery, and a continuing decrease in the voltage and the remaining capacity of the battery; (2) due to continuous current passing through the interior of the battery, heat may be generated locally, and a complex electrochemical reaction may be further triggered, resulting in a continuing aggregation of heat, which further leads to battery combustion.

Because the internal short-circuit of a battery has characteristics of low predictability, interminableness, and high level of perniciousness, when an on-board power battery is in use, discovering and dealing with the internal short-circuit of the power battery as early as possible is vital for ensuring the reliability and the operating safety of a vehicle.

At present, methods for determining internal short-circuit of a battery can be one of the followings:

1. By way of disassembling analysis of a suspected internal short-circuited battery, determining whether an internal short-circuit occurs in the battery based on whether the insulation barrier is damaged; this method is presently the most accurate method for determining whether an internal short-circuit of a battery occurs, which is often used as an analysis of causes and a subsequently improved method, however, this method may not be able to satisfy the needs for online detection when an on-board power battery is in use, and accordingly fail to detect and deal with the occurrence of an internal short-circuit of a power battery in time.

2. By detecting a difference between static voltages of batteries, determining whether an internal short-circuit occurs in a battery based on whether the difference between static voltages continuously grows; this method needs a longer time for detecting and determining per se, and due to the existence of battery balancing, the internal short-circuit may not be effectively determined in time when the on-board power battery is in use.

3. An online detection method provided in "Detection method for internal short-circuits of power batteries" (patent grant publication NO. CN102565611B), comprises: (1) detecting whether a voltage of a battery is lower than a preset value to determine whether to mark the battery as internal short-circuited; (2) detecting whether the difference between static voltages at the discharging terminals of batteries is too wide to determine whether to mark the battery as internal short-circuited; (3) further determining whether the internal short-circuit of the battery marked in (1) and (2) is true, by detecting the number of charging and discharging voltage cut-offs of a battery.

The core ideas of the above methods 2 and 3 are both determining whether an internal short-circuit occurs in a battery based on the difference between the state of charge of batteries, however, there are usually multiple reasons for resulting in the determinations in above methods to be made in accordance with said phenomenon, for example: because the batteries per se have differences in consistency, which renders the capacity degradations among battery monomers to be inconsistent, causing a problem of excessively rapid degradation for part of the parallel battery cells, and due to the problem of poor contact between the battery and the voltage sampling circuit, both of which may lead to the occurrence of above phenomenon, however, these problems are not caused by the internal short-circuit of the battery.

Meanwhile, since all existing on-board battery management systems have a balancing function for the batteries to balance the differences between batteries, when an internal short-circuit of a battery occurs, the above phenomenon will not happen until the internal short-circuit has sustained for a certain period of time, which accordingly further reduces the effectiveness of the above methods 2 and 3 in practical applications.

SUMMARY

In order to address the above defects in the prior art, i.e. in order to quickly and accurately discover an internal short-circuit of a battery, the present application provides an online detection method for internal short-circuit of power battery, which comprises the following steps:

In the process of charging and discharging, when the state of charge of a power battery is greater than a preset first threshold, monitoring and recording the voltage for each cell in the power battery;

In accordance with the recorded historical voltages of each cell, determining whether there is a cell with voltage less than a second threshold in the process of charging, and less than a third threshold in the process of discharging, if so, then marking the corresponding cell as an internal short-circuited cell.

Preferably, prior to said monitoring the voltage for each cell of the power battery, a step is provided for determining whether to monitor or not, said step comprising:

Calculating the voltage differences between each string of cells in the power battery, if there is a voltage difference that is less than a preset fourth threshold, monitoring the voltage of each cell in the power battery.

Preferably, said second threshold is the difference between the average voltage of all cells in the power battery and a preset first voltage variable, and said third threshold is the difference between the average voltage of all cells in the power battery and a preset second voltage variable.

Preferably, the method for detecting a cell with voltage less than the second threshold in the process of charging is:

Step A1, in accordance with the monitored voltage of each cell, calculating the average voltage of all cells in the power battery, and correspondingly calculating the second threshold;

Step A2, successively comparing the voltage of each cell to said second threshold, determining whether there is a cell with voltage less than said second threshold, if so, then executing step A3, if not, then executing step A4;

Step A3, marking the cell with voltage less than said second threshold as the lowest voltage cell in the charging process.

Step A4, waiting until the charging current is larger than a preset value of charging current to repeat the above steps.

Preferably, the value range of said preset value of charging current is [2 C, 5 C], wherein C is the charge-discharge rate.

Preferably, said preset value of charging current is 2 C.

Preferably, the method for detecting a cell with voltage less than a third threshold in the process of discharging is:

Step B1, in accordance with the monitored voltage of each cell, calculating the average voltage of all cells in the power battery, and correspondingly calculating the third threshold;

Step B2, successively comparing the voltage of each cell to said third threshold, determining whether there is a cell with voltage less than said third threshold, if so, then executing step B3, if not, then executing step B4;

Step B3, marking the cell with voltage less than said third threshold as the lowest voltage cell in the process of discharging;

Step B4, waiting until the discharging current is larger than a preset value of discharging current to repeat the above steps.

Preferably, the value range of said preset value of discharging current is [5 C, 8 C], wherein C is the charge-discharge rate.

Preferably, said preset value of discharging current is 5 C.

Preferably, the value range of said first threshold is [50%, 90%].

Preferably, said fourth threshold is 20 mv.

Preferably, said first voltage variable is 50 mv; said second voltage variable is 100 mv.

Preferably, after marking the cell as internal short-circuited, a processing step is also provided, which comprises: sending a warning message and disabling charging, or disabling battery energy recovery, or operating cooling system at maximum capacity, or limiting system power to a limp home mode.

Preferably, the value range of the corresponding system power of said limp home mode is [7 kw, 10 kw].

The present application may accurately determine whether a malfunction of internal short-circuit of a power battery has occurred during the operation of a vehicle, to guarantee the safety of the vehicle and the people on-board.

DESCRIPTION OF EMBODIMENTS

The preferred embodiments of the application are described in reference with the accompanying drawings below. It should be understood by those skilled in the art that these embodiments are merely used for explaining the technical principles of the application, rather than intending to limit the scope of protection of the application.

The present application determines whether a malfunction of internal short-circuit of cell in a power battery has occurred based on the information of the battery, such as SOC (State of Charge), static voltages, the consistency of charging voltages, and the consistency of discharging voltages, etc.

The online detection method for internal short circuit of power battery of the present application, comprises the following steps:

In the process of charging and discharging, when the SOC of the power battery is greater than a preset first threshold, monitoring and recording the voltage of each cell in the power battery;

In accordance with the recorded historical voltages of each cell, determining whether there is a cell with voltage less than a second threshold in the process of charging, and less than a third threshold in the process of discharging, if so, then marking the corresponding cell as an internal short-circuited cell.

Figure 1:
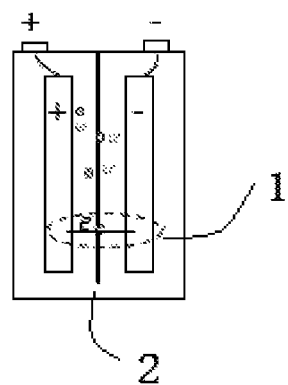
FIG. 1 is a schematic diagram of the phenomenon of internal short-circuit of a battery.
Figure 2:
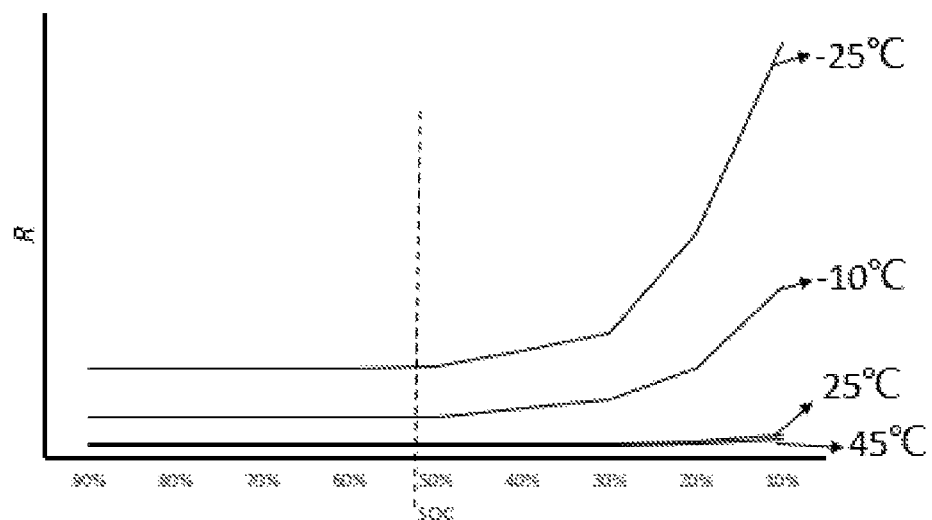
FIG. 2 is a schematic diagram of the relationship between SOC of battery and an internal resistance.

As showed in FIG. 2, the variation of the internal resistance R of a cell affects the size of the over-potential (referred to as overvoltage or super-potential) during the operation of a cell, which changes with the variation of SOC at the same temperature. In order to accurately determine whether a malfunction of internal short-circuit of a power battery has occurred, a detection within a particular range of SOC is required, to reduce the variation of the internal resistance of the battery. The particular range of SOC is larger than the interval of the preset first threshold, which is usually greater than 50% of the SOC value.

In order to reduce the operation load of the system, the present application provides a step for determining whether to monitor or not, before monitoring the voltage of each cell in the power battery, said step comprises: calculating the voltage differences between each string of cells in the power battery, if there is a voltage difference that is less than a preset fourth threshold, then monitoring the voltage of each cell in the power battery.

The cell structure in the power battery is generally described by way of "N parallels M serials", wherein "N parallels" represents N strings of serial cells, "M serials" represents that M cells are set in series in each string of serial cells; said each string of cells is the respective cells set in series in a string of serial cells, said voltage differences between each string of cells are the voltage differences between the respective cells set in series.

In this embodiment, said second threshold is the difference between the average voltage of all cells in the power battery and a preset first voltage variable, and said third threshold is the difference between the average voltage of all cells in the power battery and a preset second voltage variable.

The malfunction of internal short-circuit of a cell, when it gets severe, may trigger a thermal runaway of a cell monomer. A thermal runaway is a phenomenon that a chemical reaction, such as a drastic electrolyte decomposition, etc., is triggered inside a cell due to a higher temperature, so that a continuous temperature rise and an accompanying release of high temperature gas/liquid take place. Therefore, a corresponding processing step is required to be provided after determining that a malfunction of internal short-circuit of a battery has occurred, so as to guarantee the safety of the vehicle and the people on-board.

After determining that a malfunction of internal short-circuit of a battery has occurred, the processing steps provided may comprise sending a warning message and any one of the following schemes or the combination thereof:

(1) The system power is limited to a limp home mode: limiting the operating current of the battery, to reduce the heat in the internal short-circuit region of a cell, reducing the probability of the occurrence of thermal runaway, where the range of the corresponding system power of a limp home mode is usually [7 kw, 10 kw] in order to guarantee the mobility of the vehicle;

(2) The cooling system of the battery system operates at the maximum capacity to reduce the temperature of the battery, reducing the probability of the occurrence of thermal runaway;

(3) Energy recovery and charging are disabled, and the reserved energy of the battery should be lowered as low as possible after an internal short-circuit occurs in a battery, to reduce hazards;

(4) Charging is disabled for the battery management system.

Figure 3:
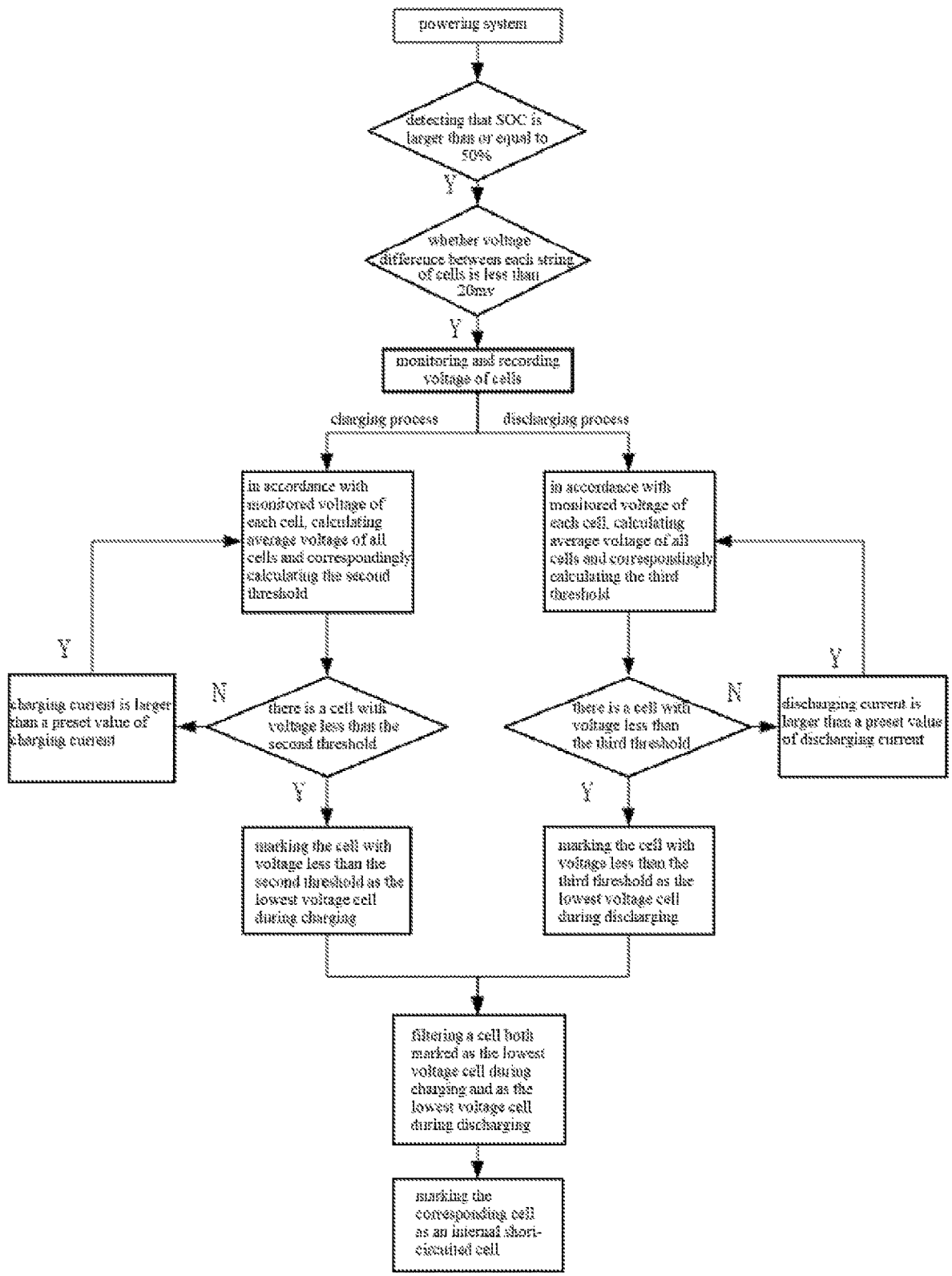
FIG. 3 is a flowchart of online detection method for internal short-circuit of power battery of the present application.

As showed in FIG. 3, a description is given in detail in combination with preferred embodiments hereinafter, in which the method comprises:

Step 1, detecting whether the present SOC of the power battery is greater than the preset first threshold, if so, then executing step 2. The value range of the first threshold is [50%, 90%], and the value in this embodiment is 50%.

Step 2, calculating the voltage differences between each string of cells in the power battery, if there is a voltage difference less than a preset fourth threshold, then monitoring and recording the voltage of each cell in the power battery, and executing step 3. The fourth threshold is preferably 20 mv.

Step 3, if it is a charging process, executing step 4, otherwise executing step 5;

Step 4, detecting a cell with voltage less than a second threshold in the process of charging, which specifically comprises step A1~step A4. The second threshold is the difference between the average voltage of all cells in the power battery and a preset first voltage variable, the first voltage variance is preferably 50 mv.

Wherein, the step of detecting a cell with voltage less than a second threshold in the process of charging comprises:

Step A1, in accordance with the monitored voltage of each cell, calculating the average voltage of all cells in the power battery, and correspondingly calculating the second threshold;

Step A2, successively comparing the voltage of each cell to said second threshold, determining whether there is a cell with voltage less than said second threshold, if so, then executing step A3, if not, then executing step A4;

Step A3, marking the cell with voltage less than said second threshold as the lowest voltage cell in the charging process.

Step A4, waiting until the charging current is larger than a preset value of charging current to repeat the above steps. The value range of said preset value of charging current is preferably [2 C, 5 C], and the preset value of charging current in this embodiment is 2 C, wherein C is the charge-discharge rate.

Step 5, detecting a cell with voltage less than a third threshold in the process of discharging, which specifically comprises step B1~step B4. Said third threshold is the difference between the average voltage of all cells in a power battery and a preset second voltage variable, and said second voltage variance is preferably 100 mv.

Wherein, the step of detecting a cell with voltage less than a third threshold in the process of discharging comprises:

Step B1, in accordance with the monitored voltage of each cell, calculating the average voltage of all cells in the power battery, and correspondingly calculating the third threshold;

Step B2, successively comparing the voltage of each cell to said third threshold, determining whether there is a cell with voltage less than said third threshold, if so, then executing step B3, if not, then executing step B4;

Step B3, marking the cell with voltage less than said third threshold as the lowest voltage cell in the process of discharging;

Step B4, waiting until the discharging current is larger than a preset value of discharging current to repeat the above steps. The value range of said preset value of discharging current is preferably [5 C, 8 C], and the preset value of discharging current in this embodiment is 5 C.

Step 6, filtering a cell which is both marked as the lowest voltage cell in the process of charging and as the lowest voltage cell in the process of discharging, and marking the corresponding cell as an internal short-circuited cell.

It should be realized by those skilled in the art that the steps of approaches of each example described in combination with the embodiments disclosed herein may be implemented with an electronic hardware, a computer software, or the combination thereof. In order to explain the interchangeability of electronic hardware and software, the composition and the steps of each example have been described generally according to functions in the description above. Whether these functions are executed in the way of electronic hardware or software, depends on particular applications and constraint conditions of design of the technical scheme. Those skilled in the art may use different methods to implement the described functions for each particular application, however, these implementations are not to be construed as departing from the scope of the application.

Hereto, the technical scheme of the present application has been described in combination with the preferred embodiments showed in the accompanying drawings, however, it should be readily understood by those skilled in the art that the scope of protection of the application is apparently not limited to these particular embodiments. Equivalent modifications or alternations may be made by those skilled in the art without departing from the principle of the application, and the technical scheme after these modifications or alternations will fall within the scope of protection of the application.

What is claimed is:

1. An online detection method for internal short-circuit of power battery, comprising the following steps:
   in the process of charging and discharging, when the state of charge of the power battery is greater than a preset first threshold, monitoring and recording the voltage for each cell in the power battery;
   in accordance with the recorded historical voltages of each cell, determining whether there is a cell with voltage less than a second threshold in the process of charging, and less than a third threshold in the process of discharging, if so, then marking the corresponding cell as an internal short-circuited cell;
   wherein prior to said monitoring the voltage for each cell of the power battery, a step is provided for determining whether to monitor or not, said step comprising:
   calculating the voltage differences between each string of cells in the power battery, if there is a voltage difference that is greater than a preset fourth threshold, then monitoring the voltage of each cell in the power battery.

2. The method of claim 1, wherein said second threshold is the difference between the average voltage of all cells in the power battery and a preset first voltage variable, and said third threshold is the difference between the average voltage of all cells in the power battery and a preset second voltage variable.

3. The method of claim 2, wherein the method for detecting a cell with voltage less than the second threshold in the process of charging is:
   step A1, in accordance with the monitored voltage of each cell, calculating the average voltage of all cells in the power battery, and correspondingly calculating the second threshold;
   step A2, successively comparing the voltage of each cell to said second threshold, determining whether there is a cell with voltage less than said second threshold, if so, then executing step A3, if not, then executing step A4;
   step A3, marking the cell with voltage less than said second threshold as a low voltage cell in the charging process;
   step A4, waiting until the charging current is larger than a preset value of charging current to repeat the above steps.

4. The method of claim 3, wherein value range of said preset value of charging current is [2 C, 5 C], where C is the charge-discharge rate.

5. The method of claim 3, wherein said preset value of charging current is 2 C.

6. The method of claim 2, wherein the method for detecting a cell with voltage less than a third threshold in the process of discharging is:
   step B1, in accordance with the monitored voltage of each cell, calculating the average voltage of all cells in the power battery, and correspondingly calculating the third threshold;
   step B2, successively comparing the voltage of each cell to said third threshold, determining whether there is a cell with voltage less than said third threshold, if so, then executing step B3, if not, then executing step B4;
   step B3, marking the cell with voltage less than said third threshold as a low voltage cell in the process of discharging;
   step B4, waiting until the discharging current is larger than a preset value of discharging current to repeat the above steps.

7. The method of claim 6, wherein value range of said preset value of discharging current is [5 C, 8 C], where C is the charge-discharge rate.

8. The method of claim 7, wherein, said preset value of discharging current is 5 C.

9. The method of claim 1, wherein value range of said first threshold is [50%, 90%].

10. The method of claim 1, wherein said forth threshold is 20 mv.

11. The method of claim 2, wherein said first voltage variable is 50 mv; and said second voltage variable is 100 mv.

12. The method of claim 1, wherein after making the cell as internal short-circuited, a processing step is also provided, which comprises: sending a warning message and disabling charging, or disabling battery energy recovery, or operating cooling system at maximum capacity, or limiting system power to a limp home mode.

13. The method of claim 2, wherein said forth threshold is 20 mv.

14. The method of claim 3, wherein said first voltage variable is 50 mv; and said second voltage variable is 100 mv.

15. The method of claim 2, wherein value range of said first threshold is [50%, 90%].

16. The method of claim 2, wherein after making the cell as internal short-circuited, a processing step is also provided, which comprises: sending a warning message and disabling charging, or disabling battery energy recovery, or operating cooling system at maximum capacity, or limiting system power to a limp home mode.

* * * * *